United States Patent [19]

Schönherr et al.

[11] Patent Number: 5,321,792
[45] Date of Patent: Jun. 14, 1994

[54] APPARATUS FOR THE CONTINUOUS FEEDING OF WIRE TO AN EVAPORATOR BOAT

[75] Inventors: Bernhard Schönherr, Offenbach; Thomas Vogt, Kahl; Reiner Gertmann, Linsengericht; Helmut Grimm, Darmstadt; Gerard Löbig, Frankfurt; Martin Hornung, Mömlingen, all of Fed. Rep. of Germany

[73] Assignee: Leybold Aktiengesellschaft, Hanau, Fed. Rep. of Germany

[21] Appl. No.: 932,655

[22] Filed: Aug. 20, 1992

Related U.S. Application Data

[63] Continuation-in-part of Ser. No. 773,402, Oct. 9, 1991.

[30] Foreign Application Priority Data

Jul. 31, 1991 [DE] Fed. Rep. of Germany ....... 4125350
Mar. 10, 1992 [DE] Fed. Rep. of Germany ... 9203169[U]

[51] Int. Cl.⁵ .............................................. C23C 14/56
[52] U.S. Cl. .................... 392/388; 118/726; 226/181
[58] Field of Search ............... 392/388, 389; 118/726; 226/181, 186, 187, 176, 177; 219/137.61, 137.8

[56] References Cited

U.S. PATENT DOCUMENTS

| | | | |
|---|---|---|---|
| 2,664,853 | 1/1954 | Schuler | 392/389 |
| 2,914,643 | 11/1959 | Fields et al. | 118/726 |
| 2,957,101 | 10/1960 | Barkley | 219/137.61 |
| 3,093,284 | 6/1963 | Mullin | 226/181 |
| 3,534,389 | 10/1970 | Bernard et al. | 219/137.61 |
| 3,550,830 | 12/1970 | Lagogue | 226/180 |
| 3,693,861 | 9/1972 | Boyer | 226/187 |
| 3,711,003 | 1/1973 | Boyer et al. | 226/187 |
| 4,043,494 | 8/1977 | Bickford et al. | 226/181 |
| 4,177,912 | 12/1979 | Samokovliski et al. | 226/181 |
| 4,406,252 | 9/1983 | Jones | 118/726 |
| 4,988,846 | 1/1991 | Karlsten et al. | 219/137.61 |
| 5,242,500 | 9/1993 | Elvers et al. | 118/726 |

Primary Examiner—Bruce A. Reynolds
Assistant Examiner—John A. Jeffery
Attorney, Agent, or Firm—Felfe & Lynch

[57] ABSTRACT

A coating material to be evaporated in an evaporator cell disposed in a vacuum chamber is fed in the form of a wire to the evaporator cell in accordance with the depth of the molten bath, by a wire transport including a motor-driven shaft or roller and a counter-roller mounted on a movably journaled lever which in turn is movable via an electromagnetic actuator against the force of a spring means. A wire feed tube is arranged between the wire transport which draws fusible wire from a remote supply and feeds it to the evaporator boat where the wire is evaporated for coating a band-type substrate. The feed tube has a straight section which receives the wire concentrically from the transport and a gooseneck section toward said evaporator boat which twice deflects the wire to provide three points of contact with the inner wall of the tube, thus accurately positioning the wire while preventing clogging of the outlet orifice.

13 Claims, 4 Drawing Sheets

APPARATUS FOR THE CONTINUOUS FEEDING OF WIRE TO AN EVAPORATOR BOAT

This application is a continuation in part of application Ser. No. 07/773,402, filed Oct. 9, 1991, which is now pending.

BACKGROUND OF THE INVENTION

The invention relates to an apparatus for coating workpiece surfaces, for example condenser films, with a coating material that is to be evaporated, especially pure aluminum, the coating material being fusible in an evaporator cell disposed in a vacuum chamber and being fed in the form of a piece of wire from a supply spool of wire to the evaporator cell in accordance with the depth of the molten bath, and being delivered between a motor-driven shaft and a roller providing counter-pressure, in the manner of a capstan drive.

It is common in film vapor depositing apparatus to combine a plurality of evaporator cells to form a so-called evaporator bank and to dispose this evaporator bank in the vacuum chamber in the direct vicinity of the film that is to be coated, and to draw the material that is to be evaporated in the form of wires from supply spools and transport them and feed them to the evaporator cells with the aid of friction wheeldrives. (U.S. Pat. No. 3,488,214, German Patent Disclosure Document 34 28 651, U.S. Pat. No. 2,664,853, U.S. Pat. No. 3,970,820).

Experience shows that a particular difficulty consists in making sure that the wire feeding devices of all of the evaporator cells arranged side by side and forming the evaporator bank are controlled according to the depth of the molten metal in each evaporator cell. The mechanical and electrical devices necessary for this purpose are generally of very complex design (see the apparatus according to U.S. Pat. No. 3,970,820), especially because the individual feeding devices have to be electrically insulated from one another.

If the wire evaporator consists of a band coating apparatus consisting of a plurality of individual evaporators driven by a common shaft (see EP 0,084,126) the common drive shift feeding the wire must be insulated electrically between each pair of feeding devices; this is because of the different electrical voltages that are applied to the individual evaporator cells. The drive shaft is therefore generally divided into a plurality of sections (according to the number of evaporator cells provided on the evaporator bank) and these shaft sections are joined by couplings of an insulating material.

An apparatus for the continuous coating of substrates in band form is known (DE 40 27 034), which is equipped with a plurality of evaporator boats of about the same size and configuration, forming an evaporator bank and arranged lengthwise of the direction of band movement and parallel to one another at approximately equal distances apart. The evaporator boats are all made from an electrically conductive ceramic and can be heated by the direct passage of current through them, and a device is provided for the continuous feeding of the wire to be evaporated to the evaporator boats. See also U.S. Pat. No. 5,242,500, incorporated herein by reference.

These individual evaporator boats of the evaporator bank are each arranged offset from one another, while all evaporator boats together cover a narrow coating zone running transversely of the direction of band movement.

SUMMARY OF THE INVENTION

The present invention is addressed to the problem of creating for an evaporator bank a wire feeding apparatus of especially simple construction and therefore one that can be manufactured economically, but one which will permit an individual and especially sensitive control of the wire feed.

This problem is solved according to the invention by the fact that a one-piece drive shaft provided with an at least largely electrically insulating coating, preferably made from eloxidized aluminum, cooperates with a counter-roller which is mounted on a movably journaled lever which in turn can be moved by an electromagnetic actuator against the force of a spring element, by which the friction otherwise acting between the wire on the one side and the drive on the other can be varied.

In order to bring the wire to be melted into the cavities in the evaporator boats, tubes known as wire feed tubes are used. These are usually clamped unilaterally to the wire feed device and point with their free end toward the boat.

With the introduction of the offset arrangement of the evaporator boats, the wire feed tubes had to be made of different lengths in order to avoid having different distances between the outlet orifices of the tubes and the point of contact with the cavities. This arrangement in turn had the result that the longer tubes were so greatly heated by the adjacent evaporator boat that the wire very soon clogged the outlet orifice and thus led to the failure of the entire coating apparatus.

The use of copper shields between the individual adjacent evaporator boats did not result in the success hoped for. The overheating of the outlet orifices of the tubes was reduced, but this was achieved at the expense of the disadvantage that these shields that adversely affected the uniformity of the coating to be applied to a substrate.

It is a further object of the invention to improve the apparatus so that, when offset evaporator boats are used, it will be possible to have a secure and accurately positioned feed of the fusible wire into the cavity of the evaporator boat and to prevent clogging of the outlet orifices of the wire feed tubes by molten aluminum.

This object is achieved by providing the wire feed tube with a basically gooseneck-shaped bend, and the contact surface between the wire and the inner wall of the tube is limited to only a few, preferably three, virtually point-contact rub zones.

The advantageous result of this configuration of the wire feed tubes is that the wire makes contact with the inner wall of the tube only in virtually point-contact rub zones due to its own inherent stiffness, and runs virtually friction-free in the portions between the rub zones. Consequently, the friction forces between the wire and the tube are considerably reduced. The wire consists preferably of aluminum, while the tubes are made of stainless steel. Due to the locally definable rub zones, especially by arranging for a rub zone immediately ahead of the outlet orifice, it becomes possible to bring the wire to be evaporated into the cavity securely and precisely positioned almost with bias, even over relatively long free lengths.

A coating apparatus provided with the formerly known design had to be completely cleaned no later than at the end of a shift, or the masks and tubes even had to be replaced. When the gooseneck-shaped wire feed tubes in accordance with the invention are used, a virtual doubling of the periods between cleanings is achievable.

The economic importance of this invention can be measured by the fact that heretofore——assuming that a comparable coating thickness is to be deposited——bands with a run length of approximately 30,000 meters could be coated, while with the development according to the invention, run lengths of at least 48,000 meters are achievable.

DETAILED DESCRIPTION OF THE PREFERRED EMBODIMENT

Figure 1:
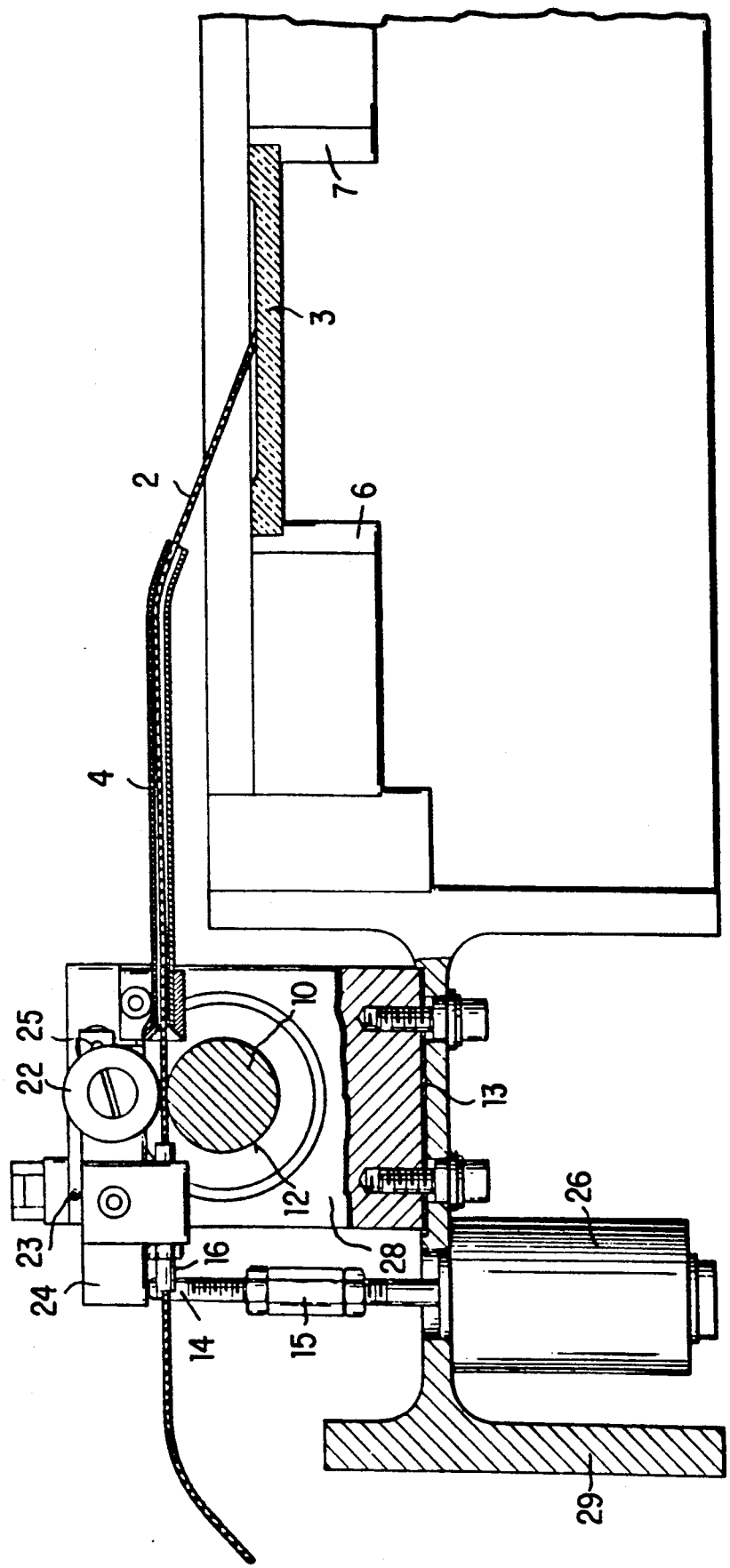
FIG. 1 is a side elevation of an apparatus for the transport of a wire to an evaporator boat.

FIG. 1 shows a side view of the apparatus for the transport and delivery of a wire to an associated evaporator cell.

The through-going, insulated drive shaft 11, of eloxidized aluminum cooperates with counter-roller 22 to apply contact pressure necessary for the transport of the wire section 27. This contact pressure is produced by a spring 23 which rotates the lever 4 about its fulcrum, the pin 25.

The lever 24 held on the pin 25 is rotated in the contrary direction by the electromagnetic actuator 26 fastened on the assembly frame 29 until the gap between the drive shaft 10 and the counter-roller 22 makes the transport of wire 7 impossible. The magnet 26 which can be actuated in the millisecond range, makes possible a continuous, variable wire feed rate by varying the actuating times.

The base body 28 which serves for mounting the drive shaft 10 and lever 24 is bolted to the frame 29 with the interposition of an insulator 13. The plunger 14 of the magnetic actuator engages the free end of the lever 24 and can be adjusted in length through the threaded coupling 15. The wire section 7 passed between the pressure roller 2 and the one-piece drive shaft 1 is guided on the one hand by a thimble 16 and on the other hand by a tube 17. The thimbles 16 are fastened to the lever 24 and the tube 17 to the base body 28. The evaporator cell 3 is clamped between jaws 18 and 19 which in turn are supported on the frame 29.

The electromagnetic actuator 26 is operated by a switching unit, which is not shown, and otherwise is fastened to the frame 9 and electrically insulated from the latter.

Figure 1A:
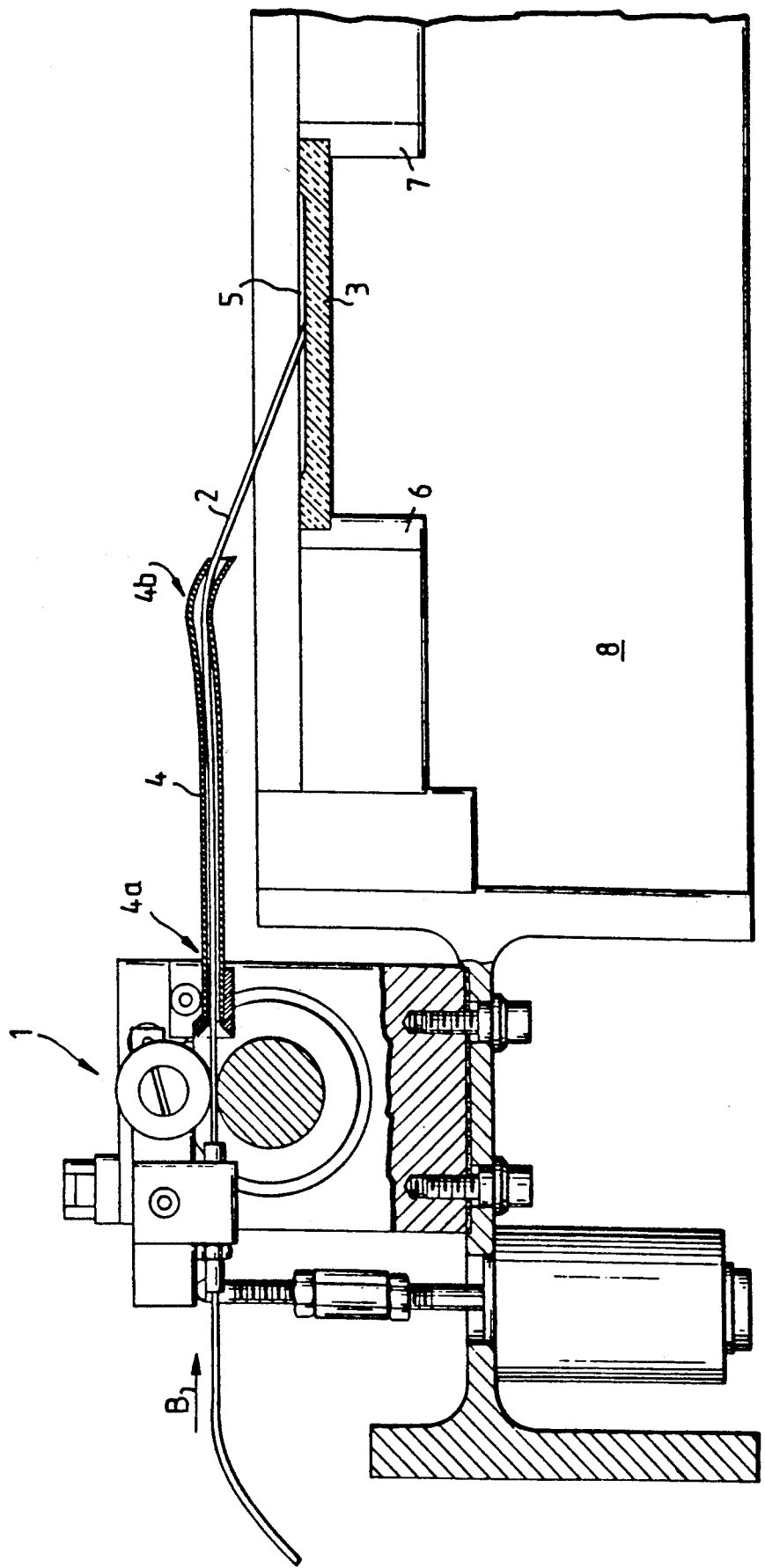
FIG. 1A is a side elevation of an apparatus for the transport of a wire to an evaporator boat with a gooseneck-shaped wire feed tube.

The transport system of FIG. 1A feeds the wire 2, which is to be evaporated and has a specific inherent stiffness, by means of a roller drive in the direction of movement B, from a magazine (not shown), to an evaporator boat 3. A wire feed tube 4 is provided for guiding the wire between the transport system 1 and the boat 3. This tube is fastened at its one, straight end 4a to the transport system 1, while the other, free end 4b is bent to an S-shape in the manner of a gooseneck and is pointed toward the boat 3. Thus the wire 2 is fed in a precisely positioned manner into the cavity 5 of the evaporator boat 3.

Figure 2:
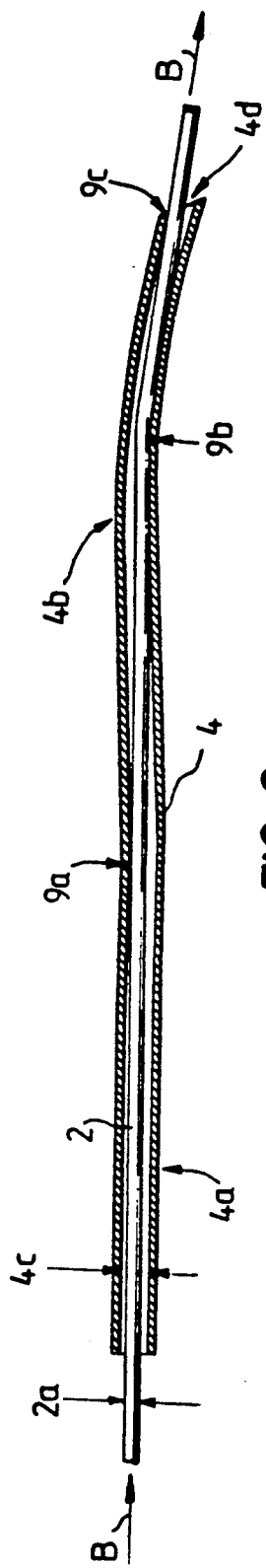
FIG. 2 is an enlarged view of a gooseneck-shaped wire feed tube according to FIG. 1A.

The boat 3 is held by two jaws 6 and 7 which are disposed in the interior of the vacuum coating chamber 8. The wire feed tube 4 in FIG. 2 has a circular cross section, in which the inside diameter 4 is made definitely greater than the outside diameter 2a of the wire 2 to be advanced in the tube 4. This wire is introduced in direction B in an approximately concentric and contact-free manner into the straight end 4a of the tube 4 and is twice deflected by the gooseneck-shaped zone 4b of the tube 4, at the outlet end of the tube facing the evaporator boat. The wire 2 contacts the inner wall of the tube 4 at the rub zones 9a, 9b, 9c, and runs without contact between the rub zones 9a, 9b, 9c due to its own stiffness.

A final rub zone 9c, in direction of movement B, directly contacts the upper side of the outlet orifice 4d of the tube 4. Due to this positive S-shaped guidance of the wire 2 in the tube 4, the wire 2 leaves the tube 4 in direction B in a "stable" position.

The term "eloxidize" or "eloxal coating" is here to be understood to mean the anodic oxidation of aluminum materials.

Figure 3:
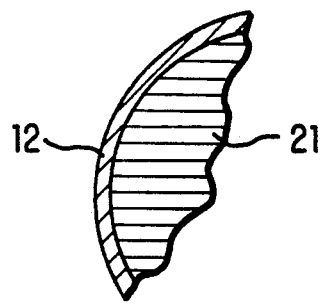
FIG. 3 is a partial end section view of the insulated drive shaft.
Figure 4:
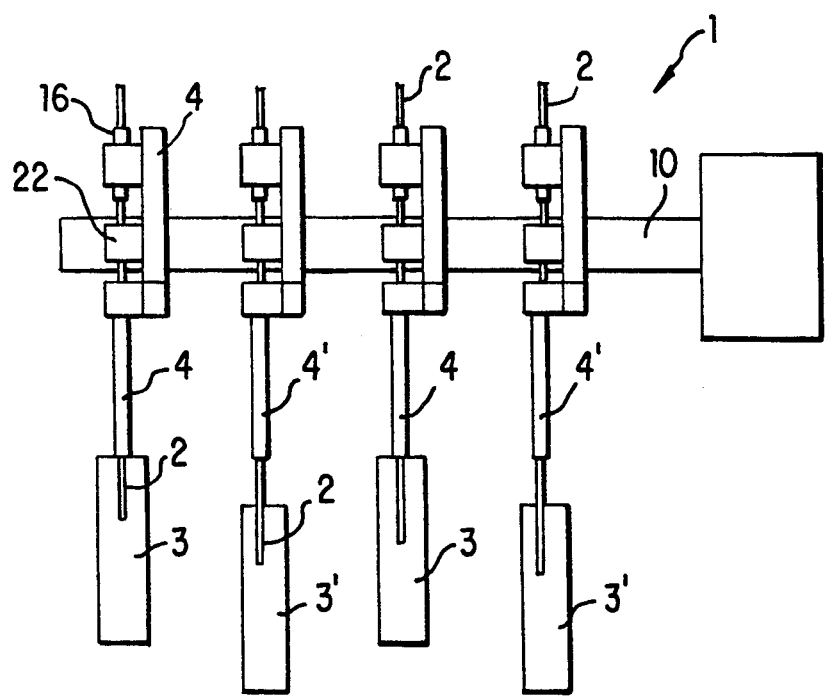
FIG. 4 is a schematic plan view of the feed arrangement used with multiple evaporator boats.

FIG. 3 shows the insulating coating 12 on the drive roller 10.

FIG. 5 shows the wire feeding apparatus of the present invention used with multiple evaporator boats 3, 3' arranged as in U.S. Pat. No. 5,242,500. The common drive shaft 10 passes through each transport system 1 but is isolated therefrom by the insulating coating shown in FIG. 3. The wires 2 pass through thimbles 16 on lever arms 4 which may be controlled individually to bring counter roller 22 downward toward the common drive shaft 10. Due to the gooseneck design, precise positioning of the wire is possible even over long free-lengths to the further boats 3'. This permits designing the system so that feed tubes to the further boats are not exposed to heat from the nearer boats 3, and thus prevents melting which clogs the outlet orifices.

We claim:

1. Apparatus for evaporating metal wire, comprising
   an evaporator boat,
   a drive roller having an electrically insulating circumferential coating,
   a base body to which said drive roller is journaled,
   a frame to which said base body is mounted,
   insulation means electrically isolating said base body from said frame,
   a counter roller mounted on a movably journaled lever for moving said counter roller toward said drive roller, and
   actuating means for moving said lever so that a wire can be engaged between said counter roller and said drive roller to feed said wire to said evaporator boat, said actuating means being insulated from said frame.

2. Apparatus as in claim 1 further comprising
   a base body to which said drive roller is journaled,
   a frame to which said base body is mounted, and
   insulation means electrically isolating said base body from said frame.

3. Apparatus as in claim 1 further comprising
   an evaporator boat to which said wire is fed, and
   a feed tube having a first end adjacent said drive roller and said counter roller, an opposed second end adjacent said evaporator boat, and an inner wall through which said wire is fed between said ends, said feed tube comprising a straight section extending from said first end and a gooseneck shaped section contiguous with said straight section and extending to said second end, said gooseneck shaped section deflecting said wire so that three points of contact between said wire and said inner wall are provided, one of said points being at said second end.

4. Apparatus as in claim 3 wherein said gooseneck shaped section comprises two bends lying in a vertical plane.

5. Apparatus as in claim 4 wherein said tube is aligned so that said point of contact at said second end is uppermost on said inner wall.

6. Apparatus for the continuous feeding of wire to an evaporator boat, comprising transport means for drawing wire from a source upstream and feeding said wire to an evaporator boat downstream, and a wire feed tube having a first end adjacent said transport means, an opposed second end adjacent an evaporator boat, and an inner wall through which said wire is fed between said ends, said feed tube comprising a straight section extending from said first end and a gooseneck shaped section contiguous with said straight section and extending to said second end, said gooseneck shaped section deflecting said wire so that three points of contact between said wire and said inner wall are provided, one of said points being at said second end.

7. Apparatus as in claim 6 wherein said gooseneck shaped section comprises two bends lying in a vertical plane.

8. Apparatus as in claim 6 wherein said tube is aligned so that said point of contact at said second end is uppermost on said inner wall.

9. Apparatus as in claim 6 wherein said transport means and said feed tube are so arranged that said wire enters said first end without contacting said inner wall.

10. Apparatus as in claim 6 wherein said gooseneck shaped section extends over half the distance between said first and said second end.

11. Apparatus for evaporating a plurality of wires, comprising a plurality of evaporator boats in a staggered array, a plurality of wire feeders arranged side by side to feed a respective plurality of wires to respective said evaporator boats, a plurality of wire feed tubes associated with respective said wire feeders and extending toward respective said evaporator boats, each said feed tube having a first end and a gooseneck shaped section contiguous with said straight section and extending to said second end, said gooseneck shaped section deflecting said wire so that three points of contact between said wire and said inner wall are provided, one of said points being at said second end.

12. Apparatus as in claim 11 wherein said wire feeders have a common drive roller with an electrically insulating coating, each wire feeder having a counter roller and actuating means for moving said counter roller toward said drive roller to engage a wire between said counter roller and said drive roller.

13. Apparatus as in claim 11 wherein said feed tubes are all substantially the same length.

* * * * *